United States Patent
Chen et al.

(10) Patent No.: US 7,544,618 B2
(45) Date of Patent: Jun. 9, 2009

(54) TWO-STEP CHEMICAL MECHANICAL POLISHING PROCESS

(75) Inventors: Chun-Fu Chen, Taipei (TW); Yung-Tai Hung, Chiayi (TW); Chi-Tung Huang, Hsinchu (TW); Yun-Chi Yang, Hsinchu (TW)

(73) Assignee: Macronix International Co., Ltd. (TW)

( * ) Notice: Subject to any disclaimer, the term of this patent is extended or adjusted under 35 U.S.C. 154(b) by 29 days.

(21) Appl. No.: 11/419,129

(22) Filed: May 18, 2006

(65) Prior Publication Data

US 2007/0269985 A1    Nov. 22, 2007

(51) Int. Cl.
*H01L 21/302* (2006.01)
*H01L 21/461* (2006.01)

(52) U.S. Cl. .............. 438/693; 257/E21.244; 257/E21.304; 438/691; 438/692

(58) Field of Classification Search ......... 438/691–693, 438/689, 424; 257/E21.244, E21.304
See application file for complete search history.

(56) References Cited

U.S. PATENT DOCUMENTS

| | | | |
|---|---|---|---|
| 6,429,134 B1* | 8/2002 | Kubota et al. | 438/692 |
| 7,241,725 B2* | 7/2007 | Bian | 510/175 |
| 2002/0006768 A1* | 1/2002 | Wada et al. | 451/41 |
| 2003/0036339 A1* | 2/2003 | Bonner et al. | 451/41 |
| 2005/0148184 A1* | 7/2005 | Hsu et al. | 438/692 |
| 2006/0148205 A1* | 7/2006 | Akiba et al. | 438/424 |
| 2006/0228991 A1* | 10/2006 | Kitajima et al. | 451/5 |

\* cited by examiner

*Primary Examiner*—Asok K Sarkar
(74) *Attorney, Agent, or Firm*—Baker & McKenzie LLP

(57) ABSTRACT

A chemical mechanical polishing method is disclosed. The method includes forming a film on a wafer having at least one trench structure thereon; polishing the surface of the film by providing a polishing composition to provide a first polished surface; rinsing the first polished surface with a rinse composition to provide a rinsed surface; and polishing the rinsed surface by providing a second polishing composition to provide a second polished surface.

18 Claims, 3 Drawing Sheets

TWO-STEP CHEMICAL MECHANICAL POLISHING PROCESS

BACKGROUND

1. Field of the Invention

Embodiments of the invention relate to methods of chemical mechanical polishing and related device structures.

2. Background of the Invention

Reductions in semiconductor device dimensions provide higher densities and improved performance for integrated circuits. In many integrated electronic devices, millions of discrete elements, such as transistors, resistors and capacitors are built in close proximity and integrated onto a single device. The combined layers of neighboring devices can form parasitic devices. Thus, one of the important initial steps in the fabrication of semiconductor devices is to electrically isolate adjacent electronic devices on a common substrate.

One technique for forming isolation structures is referred to as the shallow trench isolation (STI) process. To form shallow trench isolation structures a thin pad oxide is first grown on a semiconductor substrate. Thereafter a thin silicon nitride layer is deposited on the pad oxide. The pad oxide and the nitride are then etched to define the area of the isolation structure. Next, the semiconductor substrate is anisotropically etched to form a trench in the substrate. The trench is then filled with a dielectric material such as silicon dioxide. Typically in the manufacture of an integrated circuit, the deposited silicon dioxide has a very rough surface topography due to the differences in the size and the density of the trenches within the circuit. To make the final STI structure, the deposited silicon dioxide is polished off using CMP to produce a substantially planar surface.

CMP combines both chemical action and mechanical forces and is commonly used to remove metal and dielectric overlayers in damascene processes, remove excess oxide in shallow trench isolation steps, and to reduce topography across a dielectric region. Components required for CMP include a chemically reactive liquid medium and a polishing surface to provide the mechanical control required to achieve planarity. The slurry may contain inorganic particles to enhance the reactivity and mechanical activity of the process.

Typically in case of dielectric polishing, the surface may be softened by the chemical action of the slurry, and then removed by the action of the particles. CMP is the only technique currently known for producing die level flatness required for sub 0.5 μm devices and is considered a requirement for the production of sub 0.2 μm shallow device isolation structures and state-of-the-art metal interconnect schemes.

During deposition of silicon dioxide for STI formation, the surface morphology of the silicon dioxide can be extremely rough because of the wide variation in the pattern density and dimensions of the trenches. For example, the dimensions of the trenches can vary from less than 0.1 μm to 1 mm, while the spacing between the trenches can also vary by about the same amount. Additionally the density of the patterns, which is defined as the ratio of the trench area to the total area, can vary from as low as 1% to nearly 100%. These wide variations in the size, spacing, and the density of the trenches generally lead to very wide variations in the surface morphology of the silicon dioxide or other dielectric filler material to be polished.

Once the planar removal of the oxide layer is accomplished using standard silica slurries which typically operate in alkaline environments, the CMP process can generally be stopped at the underlying silicon nitride layer. The nitride layer typically has a polishing selectivity of less than 5:1 when compared to silicon dioxide polishing.

A limitation of conventional CMP is its high dependency on pattern density, which results in a non-uniform planarization of large and small features. The non-uniform planarization is often referred to as within wafer non-uniformity (WIW NU). As a result, over-polishing is required to completely remove the oxide in the active areas. Otherwise, the remaining oxide will affect the removal of the nitride layer during later processing steps. Dishing can occur due to the higher removal rate of oxide compared to that of nitride during CMP. This causes field oxide to recess below the silicon surface and contributes to potential device failure. Further, during the polishing process a thin residual layer can form on the diffusion area. This thin film on the diffusion area can induce the formation of silicon nitride residue during or after the nitride removal process.

SUMMARY

A two-step STI CMP process is employed in order to improve the polishing process and overcome problems associated with conventional CMP processess. In order to maintain a tight polishing window, advanced processing control is used to control the time of the second step in the two-step STI CMP process. The time control is based on a determination of the oxide thickness after the first step in the two-step STI CMP process. By basing the time period associated with the second step of the two-step STI CMP process on the thickness of the oxide layer after the first step, a tighter polishing window can be achieved, while still reducing the WIW NU after the STI CMP process.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

In the following description, all numbers disclosed herein are approximate values, regardless whether the word "about" or "approximately" is used in connection therewith. They may vary by up to 1%, 2%, 5%, or sometimes 10 to 20%. Whenever a numerical range with a lower limit, $R_L$, and an upper limit $R_U$, is disclosed, any number R falling within the range is specifically and expressly disclosed. In particular, the following numbers R within the range are specifically disclosed: $R=R_L+k*(R_U-R_L)$, wherein k is a variable ranging from 1% to 100% with a 1% increment, i.e. k is 1%, 2%, 3%, $ %, 5%, ..., 50%, 51%, 52%, ..., 95%, 96%, 97%, 98%, 99%, or 100%. Moreover, any numerical range defined by two numbers, R, as defined in the above is also specifically disclosed.

In order to improve upon the deficiencies of conventional STI CMP processes, a two-step STI CMP process is used in the embodiments described below. In one embodiment, the first step in the two-step STI CMP process uses a silicon dioxide ($SiO_2$) slurry. An $SiO_2$ slurry is selected because although Cerium dioxide ($CeO_2$) slurry generally has high oxide to SiN selectivity, which is useful for achieving reduced dishing and good WIW non-uniformity, it cannot easily flatten the sharp shape resulting from the HDP profile after HDP deposition. In some instances, more than three times the polishing time is required.

Thus, a $SiO_2$ base slurry can be used for a pre-planarity phase before a second $CeO_2$ polishing phase. A $CeO_2$ slurry is used for the second step because $CeO_2$ has the advantage of high oxide to SiN selectivity to achieve less dishing and wider over-polishing window.

In order to make sure that the nitride layer is residue free after the two-step STI CMP process, over-polishing is still required. It will be understood, that if conventional endpoint techniques are used with the two-step STI CMP process described herein, then the polishing window will be longer as it will include the polishing window for the first step and the second step combined. In order to improve throughput, however, it can be necessary to restrain the polishing window. Unfortunately, restraining the polishing window can increase WIW NU.

Figure 1:
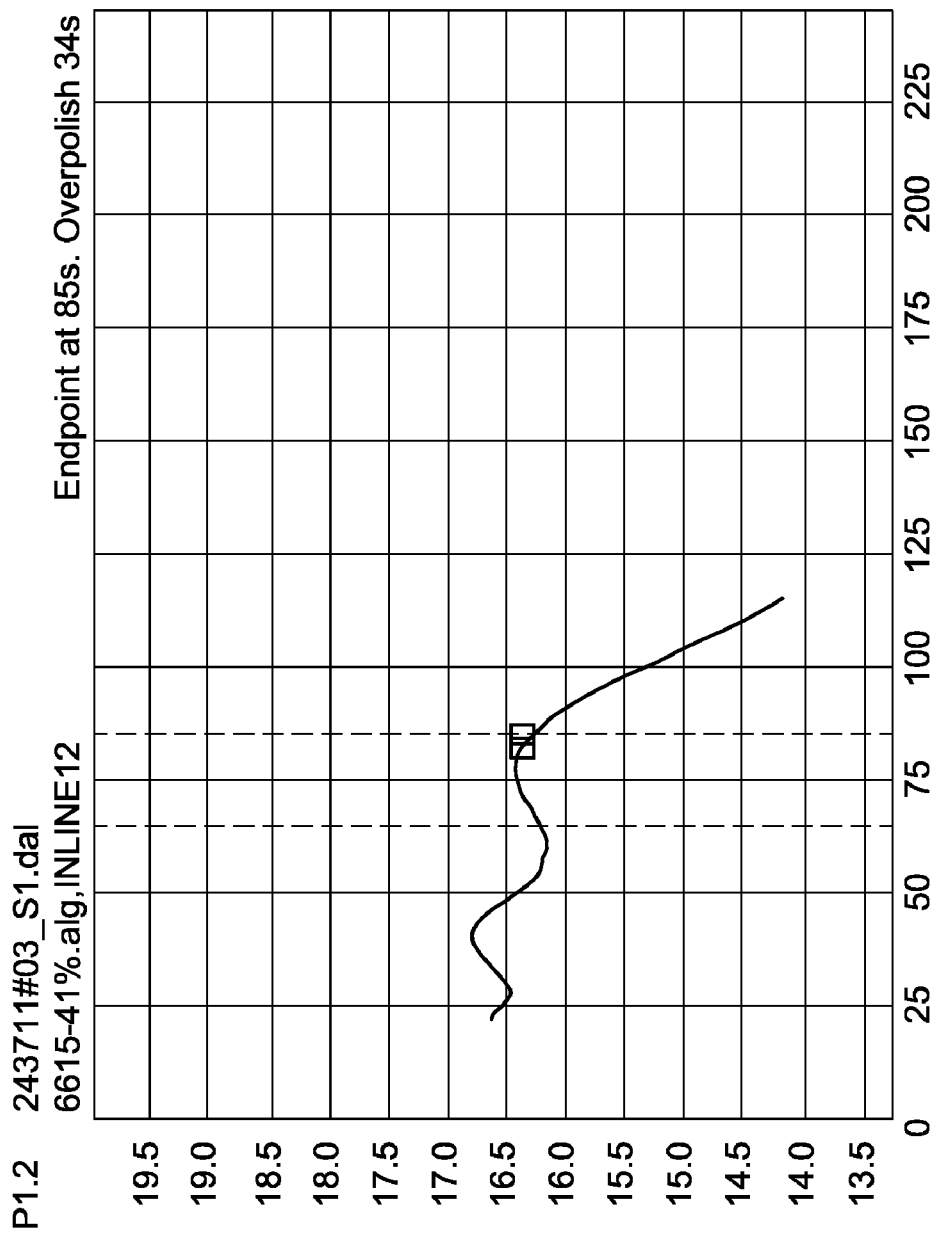
FIG. 1 is a graph illustrating the end point for typical single step STI CMP using SiO2 base slurry only.
Figure 2:
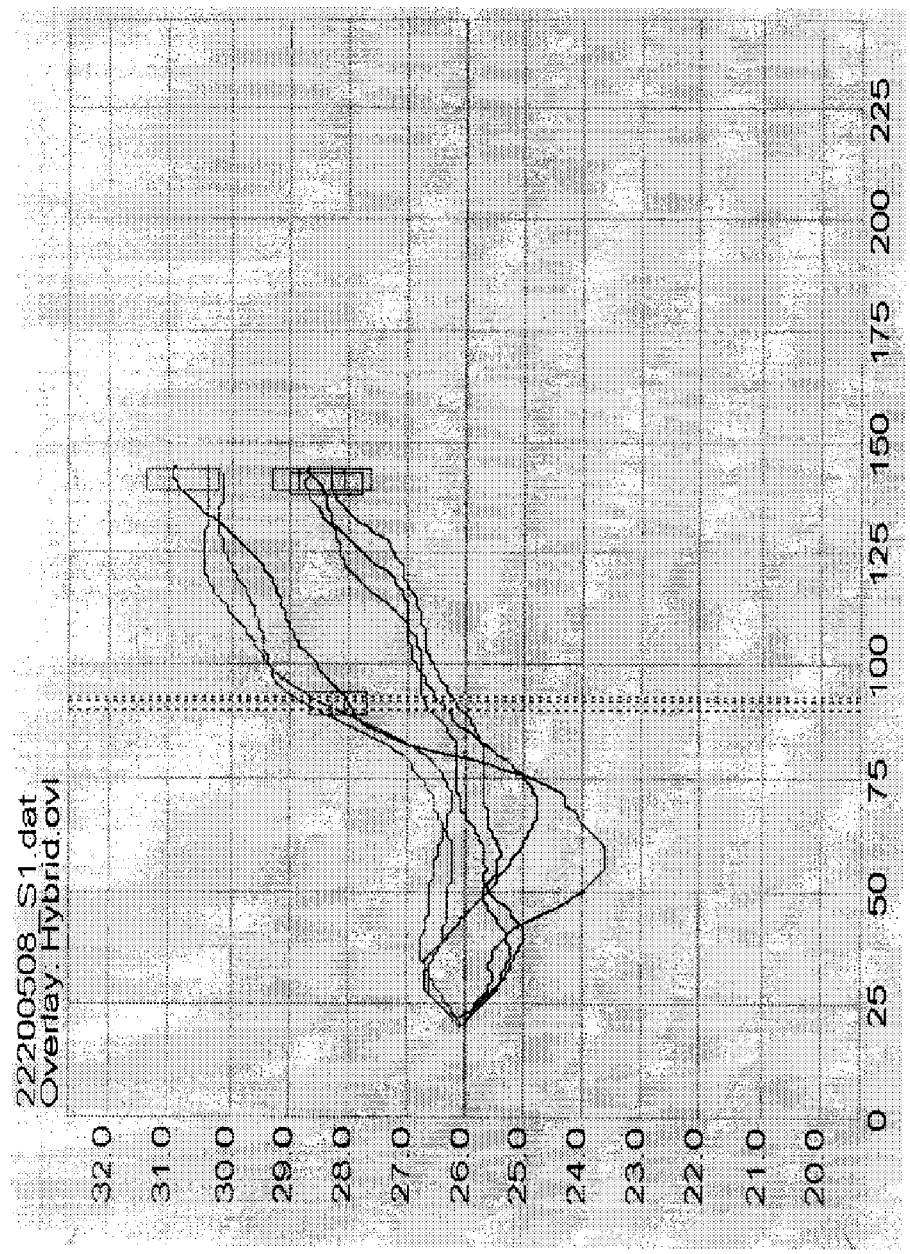
FIG. 2 is a graph illustrating the end point for a typical CeO2 slurry polishing, there is no obvious end point figure when polishing from oxide film over SiN film.

FIG. 1 is a graph illustrating a $SiO_2$ STI CMP process. As can be seen, the $SiO_2$ STI CMP process has a natural endpoint at around 85 seconds. FIG. 2 is a graph illustrating a $CeO_2$ STI CMP process. As can be seen, that $CeO_2$ STI CMP process does not have a natural endpoint. Thus, endpoint techniques cannot be used to restrain the polishing window for the two-step STI CMP process described herein.

Figure 3:
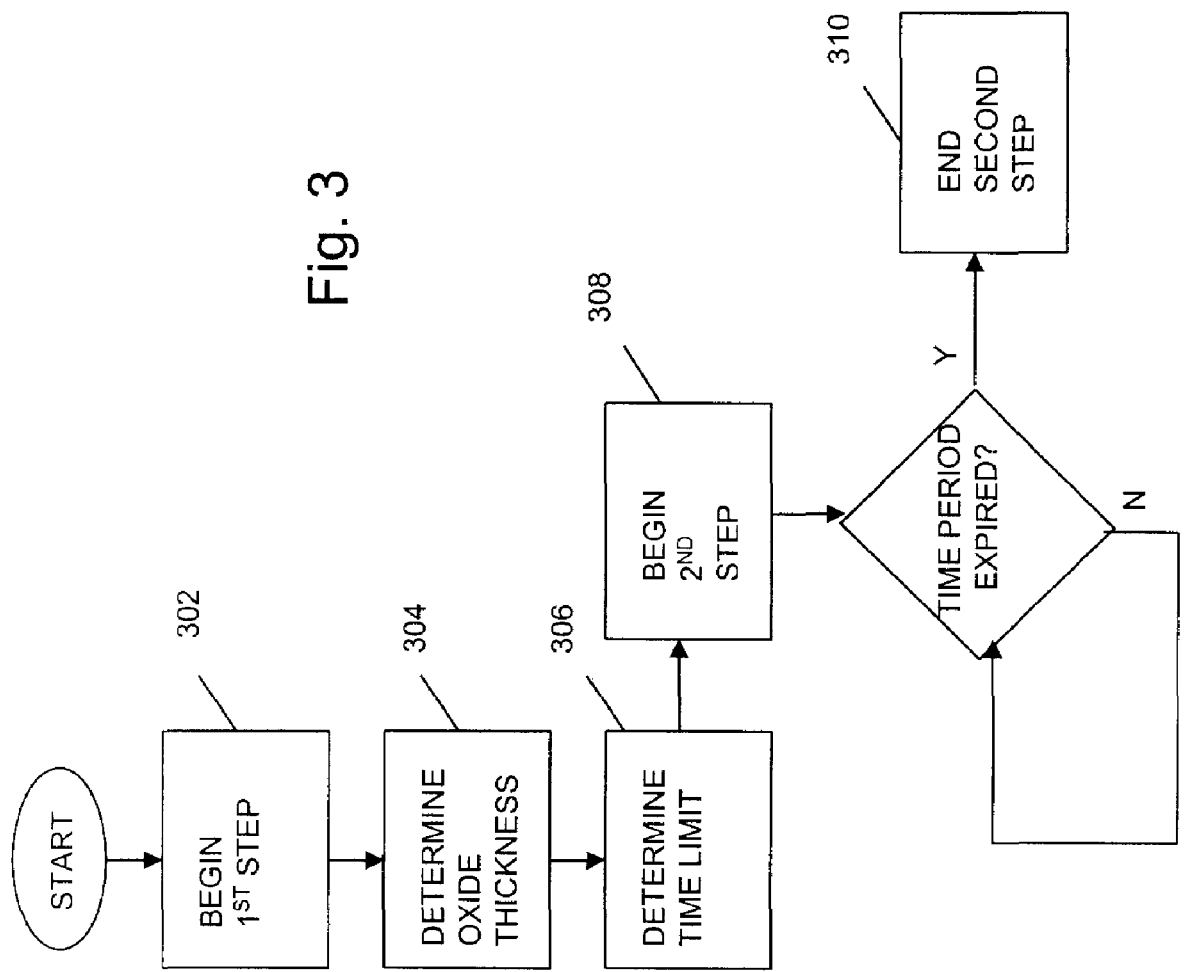
FIG. 3 is a flowchart illustrating an example two-step STI CMP process in accordance with one embodiment.

An alternative to conventional endpoint techniques, is to control the process time for one or both of the steps in the two-steps STI CMP process. Unfortunately, straightforward time control can result in an increase in WIW NU. As illustrated in FIG. 3, however, advanced processing control can be used to control the time frame, e.g., for the second step in the two-step STI CMP process described herein.

FIG. 3 is a flowchart illustrating an example for advanced processing control of the two-step STI CMP process described herein. In step 302, the first step in the CMP process can begin. Once the first step in the CMP process has ended, a determination of the remaining oxide thickness can be made in step 304. Once the oxide thickness is determined, a time limit for the second step in the two-step CMP process can be determined in step 306 based on the oxide thickness. In step 308, the second step in the two-step CMP process can begin. The second step in the two-step CMP process can continue until the time limit determined in step 306 has been reached. Once the time limit has been reached, the second step in the two-step CMP process can be terminated in step 310.

As illustrated in Table 1, typical time limits for the first and second steps in the two-step STI CMP process, when using endpoint techniques, can be anywhere from 60 to 70 seconds for the first step, and 35 to 55 seconds for the second step. But as illustrated in table 1, this can result in a wide WIW range. The wide WIW range can result in an increase in device failures. Controlling the time limit for the second step, and therefore the overall polishing time window, e.g., using the method described in FIG. 3, can reduce the WIW range and lower the potential for device failures.

TABLE 1

Off-line WIW range check of DSTI evaluation

| Polishing condtion | | WIW range | | | |
|---|---|---|---|---|---|
| 1st SiO2 | 2nd CeO2 | Array-Periphery | | Test Key | |
| 60 | 35 | 150 | 891~1041 | 200 | 759~959 |
| 60 | 55 | 100 | 893~986 | 550 | 400~957 |
| 70 | 45 | 150 | 878~1027 | 850 | 200~1053 |
| 70 | 55 | 300 | 719~971 | 850 | 0~866 |

Tables 2 through 4 can be used to illustrate one example method for determining the time limit to be used for the second polishing step. As illustrated in tables 2 through 4, the remaining oxide thickness following the first polishing step can be broken down into ranges. Each thickness range can then be associated a high and low limit for the second polishing step. As illustrated in table 1, the original oxide thickness can, for example, have a range between approximately 7,260 Å on the high side, to 5,940 Å on the low side for a particular process. The CMP polishing rate for the first step will also have a range, e.g. between approximately 2,850 Å per minute on the high side, and 2,450 Å per minute on the low side.

TABLE 2

| | High side | Low side |
|---|---|---|
| HDP Dep. | 7260 A | 5940 A |
| CMP 1st polihsing | 2850 A/min | 2450 A/min |

Thus, as illustrated in table 3, a range of the remaining oxide can be predicted using the values in table 1. As illustrated, the worst case for this range occurs on the high side when the deposition is at the high end of the range and the polishing rate for the first CMP step is at the low end of the range. In other words, the remaining oxide will be thickest when it starts out thick and the polishing rate is low. Conversely, the worst case low side occurs when the thickness after the oxide deposition is on the low side and the polishing rate for the first CMP step is on the high side. In other words, the remaining oxide will be thinnest when it starts out thin and the polishing rate is high. For the numbers illustrated in the example of table 2, this results in a range of approximately 3,000 Å to 1000 Å.

TABLE 3

| High-low side of polishing condition | | Prediction of remaing oxide on SiN |
|---|---|---|
| HDP Dep. high side | CMP 1st polihsing low side | 3000 A |
| HDP Dep. Low side | CMP 1st polihsing high side | 1000 A |

As illustrated in table 4, this range can be broken down into sub-ranges .Each sub-range can be defined by a high, a low, and a mean. Each sub-ranges can also be associated with a high and a low time limit for the second polishing step. Thus, when it is determined that the thickness of the remaining oxide (step 304) is within one of the sub-ranges illustrated in table 4, then a time limit for the seconds polishing step within the corresponding ranges illustrated in table 4 can be selected (step 306) and use to control the second polishing step.

TABLE 4

| APC control for 2nd CeO2 polishing | | | | |
| --- | --- | --- | --- | --- |
| | Remaing Ox | | 2nd polishing | |
| Mean | High | Low | High | Low |
| 1000 | 750 | 1250 | 25 | 15 |
| 1500 | 1250 | 1750 | 35 | 25 |
| 2000 | 1750 | 2250 | 45 | 35 |
| 2500 | 2250 | 2750 | 55 | 45 |
| 3000 | 2750 | 3250 | 65 | 55 |

The sub-ranges for the remaining oxide, and the corresponding time limits for the second polishing step should be optimized for a particular process. Optimization should be defined so as to achieve a reduced WIW NU after the completion of the two-step STI CMP process.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

What is claimed:

1. A chemical mechanical polishing method, comprising:
    forming a film on a wafer having at least one trench structure thereon;
    polishing the surface of the film by providing a first polishing composition;
    determining a thickness of the film after it is polished using the first polishing composition; and
    polishing the surface of the film for a time period based on the thickness of the film after it is polished using the first polishing composition by providing a second polishing composition,
    wherein the first polishing composition comprises silica and the second polishing composition comprises ceria.

2. The method of claim 1, wherein the film is a silicon nitride film.

3. The method of claim 2, wherein the first polishing composition includes silica slurry.

4. The method of claim 1, wherein the first polishing composition comprises $SiO_2$.

5. The method of claim 1, wherein the second polishing composition comprises $CeO_2$.

6. The method of claim 1, further comprising breaking the possible thickness of the film after polishing using the first composition into thickness ranges and associating a time period with each thickness range, and wherein determining the thickness of the film comprises determining what thickness range the determined thickness falls into.

7. The method of claim 6, wherein the time period for polishing the film with the second composition is the time period associated with the thickness range associated with the determined film thickness.

8. The method of claim 7, wherein the thickness ranges and the associated time periods are optimized so as to reduce within wafer non-uniformities.

9. The method of claim 1, wherein polishing using the first compound uses endpoint processing techniques.

10. A chemical mechanical polishing method, comprising:
    forming a film on a wafer having at least one trench structure thereon;
    polishing the surface of the film by providing a first polishing composition; determining a thickness of the film after it is polished using the first polishing composition;
    determining a time period based on the thickness; and
    polishing the surface of the film for the determined time period by providing a second polishing compound to provide a polished surface,
    wherein the first polishing composition comprises silica and the second polishing composition comprises ceria.

11. The method of claim 10, wherein the film is a silicon nitride film.

12. The method of claim 11, wherein the first polishing composition includes silica slurry.

13. The method of claim 10, wherein the first polishing composition comprises $SiO_2$.

14. The method of claim 10, wherein the second polishing composition comprises $CeO_2$.

15. The method of claim 10, further comprising breaking the possible thickness of the film after polishing using the first composition into thickness ranges and associating a time period with each thickness range, and wherein determining the thickness of the film comprises determining what thickness range the determined thickness falls into.

16. The method of claim 15, wherein the time period selected is the time period associated with the thickness range associated with the determined film thickness.

17. The method of claim 16, wherein the thickness ranges and the associated time periods are optimized so as to reduce within wafer non-uniformities.

18. The method of claim 10, wherein polishing using the first compound uses endpoint processing techniques.

* * * * *